US010390436B2

(12) United States Patent
Shigemitsu et al.

(10) Patent No.: US 10,390,436 B2
(45) Date of Patent: Aug. 20, 2019

(54) CAMERA MODULE AND FLEXIBLE PRINTED BOARD

(71) Applicant: Sharp Kabushiki Kaisha, Sakai, Osaka (JP)

(72) Inventors: Norimichi Shigemitsu, Sakai (JP); Fuminori Okada, Sakai (JP); Hiroyuki Yamasaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/556,347

(22) PCT Filed: Apr. 1, 2016

(86) PCT No.: PCT/JP2016/060960
§ 371 (c)(1),
(2) Date: Sep. 7, 2017

(87) PCT Pub. No.: WO2016/159367
PCT Pub. Date: Oct. 6, 2016

(65) Prior Publication Data
US 2018/0110124 A1    Apr. 19, 2018

(30) Foreign Application Priority Data
Apr. 3, 2015   (JP) ................. 2015-077233

(51) Int. Cl.
*H05K 1/18*     (2006.01)
*G02B 7/02*     (2006.01)
(Continued)

(52) U.S. Cl.
CPC ............. *H05K 1/189* (2013.01); *G02B 7/02* (2013.01); *G02B 7/08* (2013.01); *H04N 5/2253* (2013.01);
(Continued)

(58) Field of Classification Search
CPC .......... H05K 2201/09136; H05K 2201/10121; H05K 2201/10151; H05K 1/189;
(Continued)

(56) References Cited

U.S. PATENT DOCUMENTS

| 6,040,529 A * | 3/2000 | Takeshita ............... H05K 1/118 174/254 |
| 2010/0200898 A1* | 8/2010 | Lin ................... H01L 27/14618 257/294 |

(Continued)

FOREIGN PATENT DOCUMENTS

| JP | 09-322075 A | 12/1997 |
| JP | 2004-153855 A | 5/2004 |

(Continued)

OTHER PUBLICATIONS

Official Communication issued in International Patent Application No. PCT/JP2016/060960, dated Jun. 28, 2016.

*Primary Examiner* — Antoinette T Spinks
(74) *Attorney, Agent, or Firm* — Keating & Bennett, LLP

(57) ABSTRACT

An image surface-side group lens (18) is mounted on a flexible printed board (FPC) (2) by appropriately adjusting a height from the FPC (2) to the image surface-side group lens (18). A camera module (1) includes a sensor mounted on the FPC (2) and the image surface-side group lens (18) arranged on the sensor (14), in which the image surface-side group lens (18) is mounted on the FPC (2) with an adhesive (22) being interposed between the FPC (2) and an edge portion of the image surface-side group lens (18) on a side opposing the sensor (14).

9 Claims, 16 Drawing Sheets

(51) Int. Cl.
   *H04N 5/225*      (2006.01)
   *G02B 7/08*       (2006.01)
   *H05K 1/11*       (2006.01)

(52) U.S. Cl.
   CPC .... *H05K 1/111* (2013.01); *H05K 2201/09136* (2013.01); *H05K 2201/10121* (2013.01); *H05K 2201/10151* (2013.01)

(58) Field of Classification Search
   CPC ........ H05K 1/111; H04N 5/2253; G02B 7/02; G02B 7/08
   See application file for complete search history.

(56) References Cited

U.S. PATENT DOCUMENTS

| | | | |
|---|---|---|---|
| 2012/0019715 A1* | 1/2012 | Shen | G06F 1/1626 348/373 |
| 2012/0038813 A1* | 2/2012 | Jung | H04N 5/2254 348/340 |
| 2014/0009593 A1 | 1/2014 | Segi et al. | |

FOREIGN PATENT DOCUMENTS

| JP | 2004-235834 A | 8/2004 |
|---|---|---|
| JP | 2004-311812 A | 11/2004 |
| JP | 2009-158748 A | 7/2009 |
| JP | 2010-041213 A | 2/2010 |
| JP | 2013-105810 A | 5/2013 |
| JP | 2013-214815 A | 10/2013 |
| JP | 2014-066921 A | 4/2014 |

* cited by examiner

2a: FIXED PORTION
2a1: Cu LAYER
2a2: SUBSTRATE LAYER
2a3: SUBSTRATE LAYER
2a4: Cu LAYER
2b: VARIABLE PORTION
2b1: Cu LAYER
2b2: PI LAYER
2b3: Cu LAYER

18: IMAGE SURFACE-SIDE GROUP LENS
18a: FOOT PORTION
18b: CONTACT SURFACE

2: FLEXIBLE PRINTED BOARD
14: SENSOR
16: BONDING WIRE
20: RESIST
22: ADHESIVE

24: CONNECTOR
30: IMAGE SURFACE-SIDE GROUP LENS
30a: FOOT PORTION
30b: OPPOSED SURFACE
30c: PROTRUSION PORTION

2: FLEXIBLE PRINTED BOARD
14: SENSOR
16: BONDING WIRE
20: RESIST
22: ADHESIVE

24: CONNECTOR
40: IMAGE SURFACE-SIDE GROUP LENS
40a: FOOT PORTION
40b: FRESNEL LENS PORTION

CAMERA MODULE AND FLEXIBLE PRINTED BOARD

TECHNICAL FIELD

The present invention relates to a camera module and a flexible printed board.

BACKGROUND ART

Recently, highly dense mounting has been implemented in mounting of a camera module, and a flexible printed board (hereinafter, also referred to as an FPC) has been frequently used as a member on which the camera module is mounted. The FPC normally has a variable portion and a fixed portion and the camera module is mounted on the fixed portion in many cases.

When the fixed portion on which the camera module is mounted is warped, a sensor included in the camera module is warped accordingly and an image surface is curved, and therefore there is concern about deterioration in image capturing. Thus, it is important to suppress warping of the fixed portion in the FPC on which the camera module is mounted.

As a technique for suppressing warpage of an FPC, for example, PTL 1 discloses a technique of suppressing warpage by controlling thermal expansion coefficients of one main surface side and the other main surface side of an FPC to be equal to each other. In addition, for example, PTL 2 discloses a technique of suppressing warpage by forming substantially equal patterns on both sides of a substrate.

On the other hand, a resolution of a camera module increases rapidly. With the increase in the resolution, it is desired to improve accuracy of parts, and there is a demand to accurately adjust a height between an image surface-side lens and a sensor in an assembling process.

As a camera module mounted in a mobile terminal is desired to have a reduced height, the number of components of the camera module has been reduced and the size of the components has been reduced. In order to achieve the height reduction, there is a camera module that has an image surface-side lens arranged immediately above a sensor. When the image surface-side lens is arranged immediately above the sensor, the image surface-side lens is fixed to a board in many cases.

CITATION LIST

Patent Literature

PTL 1: Japanese Unexamined Patent Application Publication No. 2013-105810 (published on May 30, 2013)
PTL 2: Japanese Unexamined Patent Application Publication No. 2009-158748 (published on Jul. 16, 2009)

SUMMARY OF INVENTION

Technical Problem

However, a technique with which an image surface-side lens is mounted on a board by appropriately adjusting a height from the board to the image surface-side lens while achieving height reduction has not been known.

The invention was made in view of the aforementioned problems and an object thereof is to provide a camera module in which a component is able to be mounted on a board by appropriately adjusting a height from the board to the mounting component.

Solution to Problem

In order to solve the aforementioned problems, a camera module according to an aspect of the invention is a camera module including a sensor mounted on a board and an image surface-side lens arranged on the sensor, in which the image surface-side lens is mounted on the board with an organic substance member being interposed between the board and an edge portion of the image surface-side lens on a side opposing the sensor.

A flexible printed board according to another aspect of the invention includes a substrate layer and a metal layer on each of one surface side and another surface side, in which areas of the substrate layers are substantially equal to each other and areas of the metal layers are substantially equal to each other on the one surface side and the other surface side, and an organic substance member that is a deposited organic substance material is locally provided.

Advantageous Effects of Invention

According to an aspect of the invention, an effect is achieved that a mounting component is able to be mounted on a board by appropriately adjusting a height from the board to the mounting component.

DESCRIPTION OF EMBODIMENTS

[Embodiment 1]

Figure 1:
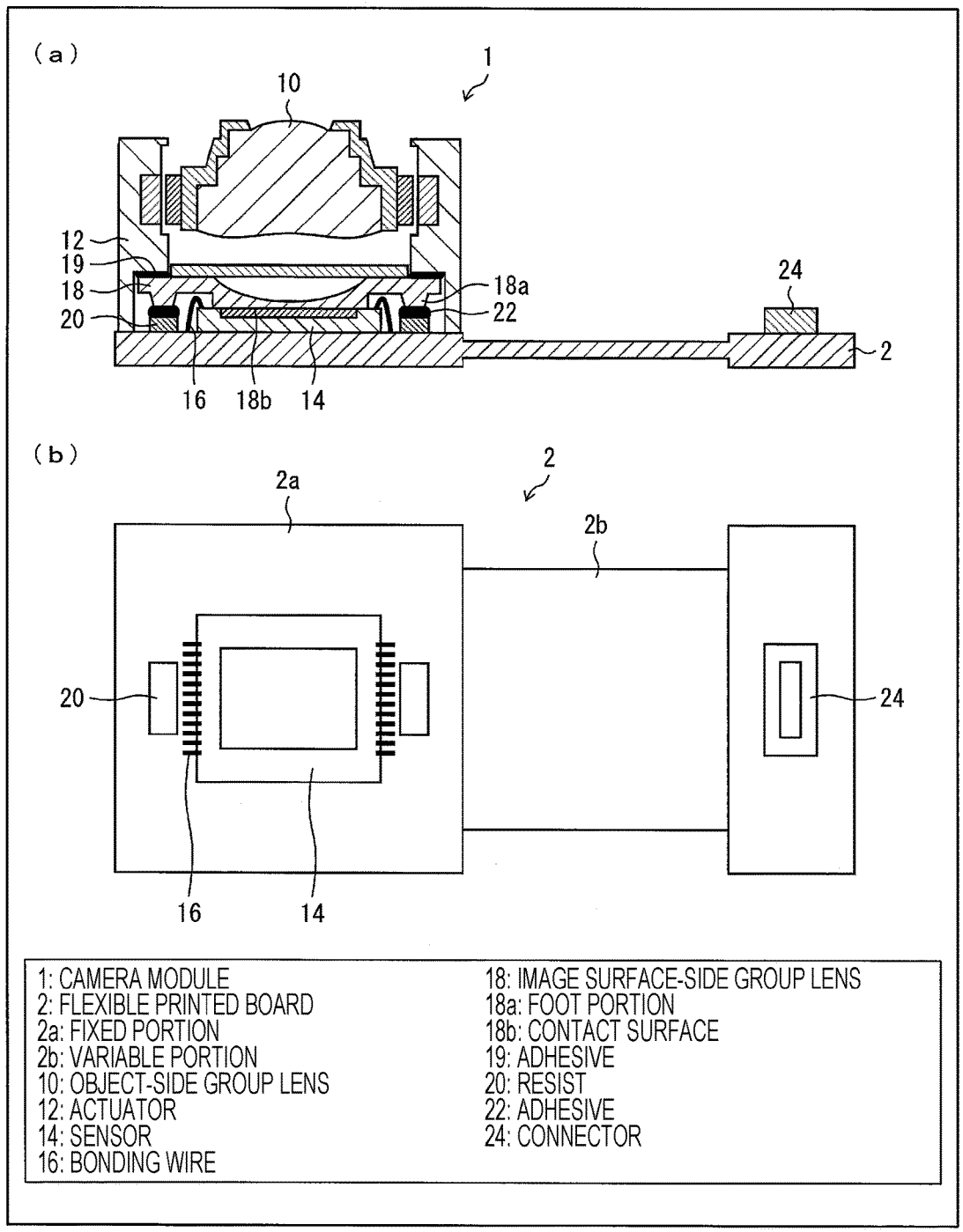
FIG. 1(a) is a cross-sectional view of an FPC on which a camera module according to Embodiment 1 of the invention is mounted and FIG. 1(b) is a top view of the FPC according to Embodiment 1 of the invention.

An embodiment of the invention will be described in detail below. FIG. 1(a) is a cross-sectional view of an FPC 2 as a board on which a camera module 1 according to the present embodiment is mounted. The camera module 1 of the present embodiment is a camera module mounted, for example, on an image capturing device, or a terminal device such as a smartphone, a mobile phone, or a tablet PC (Personal Computer). FIG. 1(b) is a top view of the FPC 2 according to the present embodiment.

In the present embodiment, the camera module 1 includes an object-side group lens 10, an actuator 12, a sensor 14, a bonding wire 16, an image surface-side group lens 18 as an image surface-side lens, an adhesive 19, a resist 20 as a cured organic substance member, and an adhesive 22 as an organic substance member.

In the present embodiment, the FPC 2 includes a fixed portion 2a and a variable portion 2b. The camera module 1 and a connector 24 are fixed to the fixed portion 2a.

(Camera Module)

The object-side group lens 10 is arranged on an object side of the image surface-side group lens 18. The object-side group lens 10 is a convex lens system.

The actuator 12 moves the object-side group lens 10 in an optical axis direction. That is, the actuator 12 has a mechanism system for realizing an autofocus (AF) function.

The actuator 12 preferably moves the object-side group lens 10 in a direction normal to the optical axis. That is, the actuator 12 preferably has a mechanism system for realizing an OIS (Optical Image Stabilizer).

That is, the camera module 1 preferably performs at least either an autofocus operation or an image stabilization operation in accordance with displacement of the object-side group lens 10.

Note that, the camera module 1 may have a fixed focus lens by which neither the autofocus operation nor the image stabilization operation is performed.

The sensor 14 converts a light signal received via the image surface-side group lens 18 into an electric signal. An example of the sensor 14 includes a solid-state image sensor and specific examples thereof include a CCD (Charge Coupled Device) and a CMOS (Complementary Metal Oxide Semiconductor). The sensor 14 is fixed to the FPC 2 by the bonding wire 16.

The image surface-side group lens 18 has a foot portion 18a and a contact surface 18b. The foot portion 18a is provided in an edge portion of the image surface-side group lens 18 on a side opposing the sensor 14. A gap between the edge portion and the FPC 2 is filled by the foot portion 18a. The foot portion 18a is preferably configured to protrude from two positions of the edge portion of the image surface-side group lens 18. When the foot portion 18a is fixed to the fixed portion 2a of the FPC 2 via the resist 20 and the adhesive 22, the image surface-side group lens 18 is mounted on the fixed portion 2a of the FPC 2.

The contact surface 18b is provided on an image surface side of the image surface-side group lens 18 and is in contact with the sensor 14. When the contact surface 18b is provided, a position and inclination of the image surface-side group lens 18 in the optical axis direction are able to be determined appropriately with the sensor 14 as a reference.

The adhesive 19 bonds and fixes the image surface-side group lens 18 to the actuator 12. Thereby, even when the foot portion 18a has a small sectional area and fixing strength between the image surface-side group lens 18 and the FPC 2 is low, the image surface-side group lens 18 is able to be fixed to the camera module 1 with high strength.

The resist 20 is formed at a portion of the FPC 2, which corresponds to a position where the foot portion 18a is arranged. The resist 20 is formed by depositing resin. As an example, the resist 20 is a film formed by a resist solution being applied to the portion of the FPC 2, which corresponds to the position where the foot portion 18a is arranged, and is formed being laminated as appropriate. The resist solution is a mixed solution containing resin such as polymer, a photosensitizer, an additive, and a solvent as main components.

The resist 20 functions to appropriately adjust a height from the FPC 2 to the foot portion 18a of the image surface-side group lens 18 so that the image surface-side group lens 18 is able to be fixed to the FPC 2. The resist 20 is able to realize minor adjustment of the height that is not able to be realized through, for example, injection molding or the like.

Though the resist is used as an example of the organic substance member in the present embodiment, a film made from an organic substance material such as resin may be laminated, as the organic substance member, on the FPC 2 instead of the resist.

The adhesive 22 is made from resins and bonds and fixes the resist 20 and the foot portion 18a.

(Flexible Printed Board)

Figure 2:
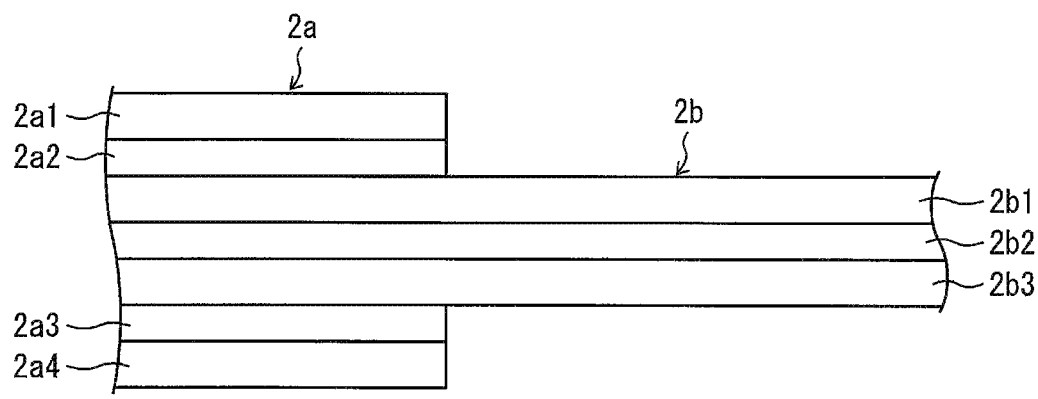
FIG. 2 is a cross-sectional view of the FPC according to Embodiment 1 of the invention.

Next, a laminated state of the FPC 2 will be described with reference to the cross-sectional view of the FPC 2 illustrated in FIG. 2.

In the FPC 2, the variable portion 2b has a Cu layer 2b1, a polyimide (hereinafter, also referred to as PI) layer 2b2, and a Cu layer 2b3 laminated. Moreover, the fixed portion 2a has a substrate layer 2a2 and a Cu layer 2a1 as a metal layer laminated on one surface side on which the camera module 1 is mounted and has a substrate layer 2a3 and a Cu layer 2a4 as a metal layer laminated on the other surface side opposite to the one surface side, in addition to the Cu layer 2b1, the PI layer 2b2, and the Cu layer 2b3.

As a material of the substrate layers 2a2 and 2a3, a resin material such as polyimide or polyester is used.

The Cu layer 2a1 is a conductor pattern layer formed on the substrate layer 2a2 and the Cu layer 2a4 is a conductor pattern layer formed on the substrate layer 2a3.

The substrate layer 2a2 and the substrate layer 2a3 are formed with substantially the same areas. The Cu layer 2a1 and the Cu layer 2a4 are formed with substantially the same areas. This makes it possible to suppress warpage of the fixed portion 2a. In other words, the areas are set so that the area of the substrate layer 2a2 and the area of the substrate layer 2a3 are substantially the same and the area of the Cu layer 2a1 and the area of the Cu layer 2a4 are substantially the same to an extent that warpage of the fixed portion 2a is able to be suppressed.

(Image Surface-Side Group Lens)

Figure 3:
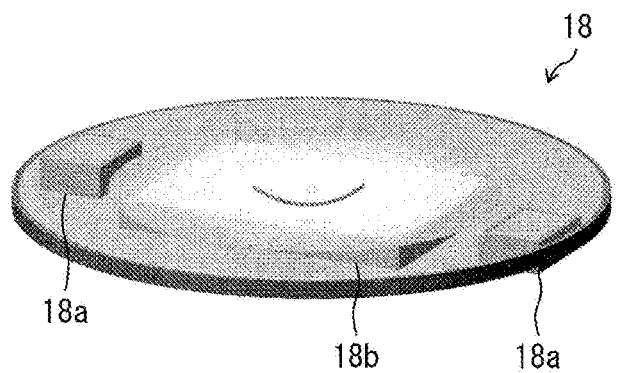
FIG. 3 is a perspective view of an image surface-side group lens according to Embodiment 1 of the invention.

FIG. 3 illustrates the image surface-side group lens 18 according to the present embodiment.

As illustrated in FIG. 3, the image surface-side group lens 18 has an object-side surface that is a surface opposing the object side and the contact surface 18b that faces the image surface side and contacts the sensor 14. The object-side surface of the image surface-side group lens 18 is a concave surface and the image surface-side group lens 18 has negative refractivity. That is, the image surface-side group lens 18 forms a telephoto-type configuration with the object-side group lens 10 that is the convex lens system, thus making it possible to achieve height reduction and excellent resolution performance.

As illustrated in FIG. 3, the image surface-side group lens 18 is a lens in which the contact surface 18b is formed into a substantially flat surface. That is, the contact surface 18b is not limited to the flat surface and is only required to transmit light. The contact surface 18b is also only required to be a surface that is sufficiently small to an extent that a change in optical characteristics (such as refractivity and decentration) that are brought is negligible small in an optical system of the camera module 1. An example of such a surface includes a surface on which minute unevenness (of order of nanometers, for example) is formed to reduce reflectivity of light or a surface that is slightly curved. When the optical system having the substantially flat surface as described above is proximate to the sensor 14, aberration correction is able to be appropriately performed. Further, the object-side surface being aspherical makes it possible to perform more effective correction.

When the image surface-side group lens 18 is viewed from the image surface side as illustrated in FIG. 3, a protrusion portion of the image-side surface is a rectangular. Note that, the shape of the protrusion portion on the image surface side is not limited to the rectangular and may be a shape other than the rectangular that has no difficulty in regarded as the rectangular. An example of such a shape other than the rectangular includes a rounded rectangular. That is, an external shape of the image surface side may be a substantially rectangular and may be determined in accordance with a shape of a light-receiving portion of the sensor 14. The external shape of the image surface side being formed into the substantially rectangular as described above makes it possible to prevent interference between the image surface-side group lens 18 and the bonding wire 16.

(Comparison between Formation Forms of Resist)

Figure 4:
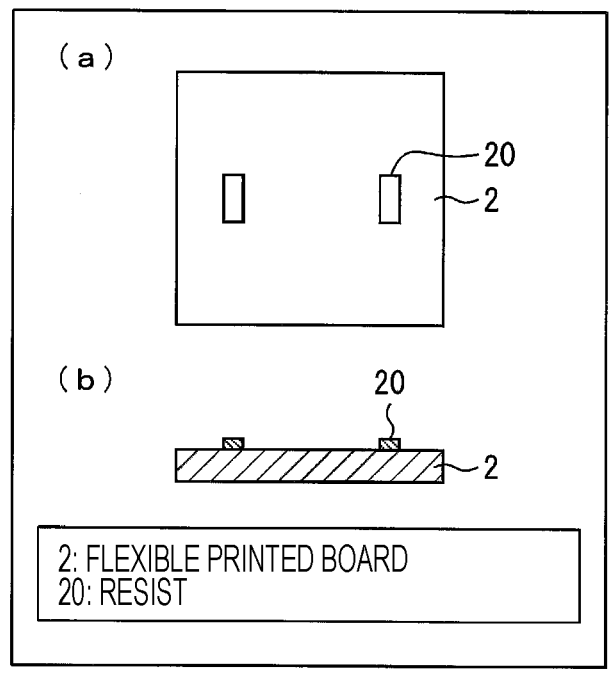
FIG. 4(a) is a top view of the FPC according to Embodiment 1 of the invention and FIG. 4(b) is a cross-sectional view of the FPC according to Embodiment 1 of the invention.

FIG. 4 is a schematic view of portions of the FPC 2 according to the present embodiment, in which the resist 20 is formed. FIG. 4(a) is a top view and the FIG. 4(b) is a cross-sectional view.

When the resist 20 is formed partially on the FPC 2 as illustrated in FIG. 4(a), warpage of the FPC 2 is small as illustrated in FIG. 4(b).

In this manner, when the resist is formed partially on the FPC 2 as in the present embodiment, warpage of the FPC 2 due to thermal expansion is able to be suppressed.

Note that, no matter where the resist is formed, an effect of suppressing warpage of the FPC 2 is able to be achieved as long as the resist is formed partially. Furthermore, no matter where the resist is formed, an effect of suppressing warpage of the FPC 2 is able to be achieved as long as the resist is locally formed. However, it is more preferable that the resist is locally formed so that the resist-formed locations are point-symmetric on the FPC 2 with a portion corresponding to a center of the image surface-side group lens 18, which is mounted on the FPC 2, as a center. The number of locations where the resist is formed is two in the present embodiment, but is not limited to two and may be three or four.

Figure 5:
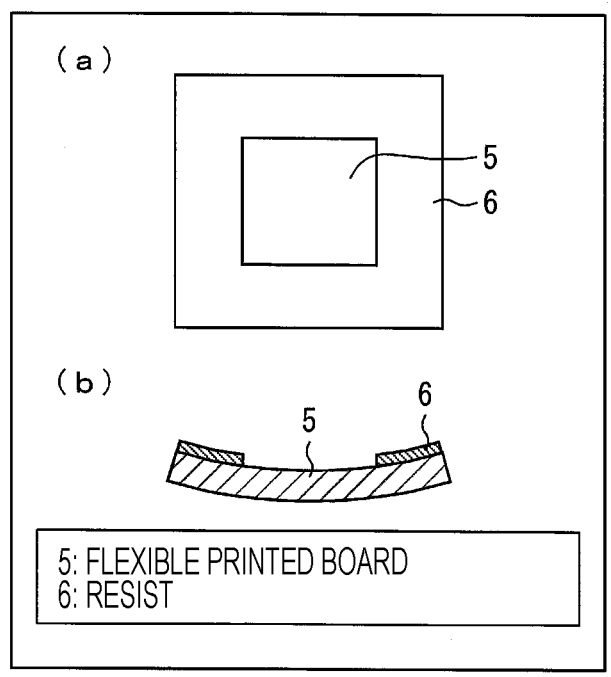
FIG. 5(a) is a top view of an FPC of a comparative example and FIG. 5(b) is a cross-sectional view of the FPC of the comparative example.

On the other hand, as a comparative example, FIG. 5 illustrates a schematic view when a resist 6 is formed on the whole of an FPC 5 excluding a portion where the sensor is mounted, that is, when the resist 6 is not formed partially. FIG. 5(a) is a top view and FIG. 5(b) is a cross-sectional view.

When the resist 6 is formed on the whole of the FPC 5 excluding the portion where the sensor is mounted as illustrated in FIG. 5(a), concave warpage is generated in the FPC 5 because of large thermal expansion coefficient of the resist 6.

When the resist is formed on the whole of the FPC 5 excluding the portion where the sensor is mounted as illustrated in FIG. 5(a), an adhesive applied to the resist flows outside to a periphery of a portion to which the adhesive is applied and the adhesive makes it difficult to appropriately adjust a height from a board to a lens. Against this, the adhesive 22 is applied to the resist 20 in an island-like shape that is locally formed in the present embodiment. Since the resist 20 is in the island-like shape, the adhesive 22 that is applied does not flow outside of the island of the resist 20 and a large amount of the adhesive 22 is not consumed, so that a height of the adhesive 22 is secured, thus making it possible to appropriately adjust the height from the FPC 2 to the image surface-side group lens 18 by the adhesive 22.

[Embodiment 2]

Figure 6:
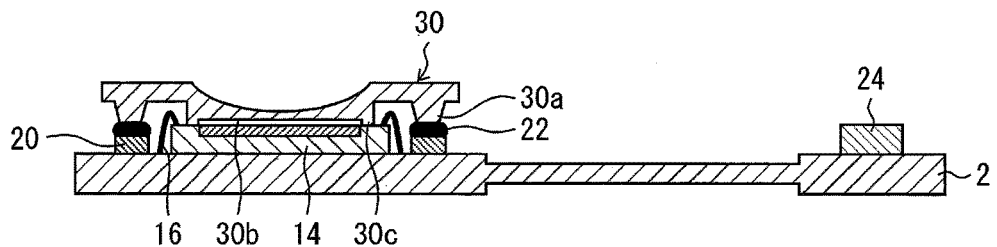
FIG. 6 is a cross-sectional view of an image surface-side group lens mounted over a sensor according to Embodiment 2 of the invention.

Embodiment 2 of the invention will be described as follows with reference to FIG. 6. Note that, for convenience of description, the same reference signs will be assigned to members having the same functions as those of the members described in the aforementioned embodiment and description thereof will be omitted.

In the present embodiment, there is a difference from the camera module 1 of Embodiment 1 in that a shape of an image surface-side group lens 30 is different.

The image surface-side group lens 30 according to the present embodiment has a foot portion 30a, an opposing surface 30b, and a protrusion portion 30c.

The foot portion 30a is provided in an edge portion of the image surface-side group lens 30 on a side opposing the sensor 14. The foot portion 30a is preferably configured to protrude from two positions of the edge portion of the image surface-side group lens 30. The image surface-side group lens 30 has the foot portion 30a mounted on the fixed portion 2a of the FPC 2 via the resist 20 and the adhesive 22.

The opposing surface 30b is provided on an image surface side of the image surface-side group lens 30 and opposes a light-receiving surface of the sensor 14.

The protrusion portion 30c is provided at a portion corresponding to a periphery of the light-receiving surface of the sensor 14. The protrusion portion 30c functions to prevent the opposing surface 30b from contacting the light-receiving surface of the sensor 14.

The opposing surface 30b not in contact with the light-receiving surface of the sensor 14 makes it possible to prevent damages to the light-receiving surface of the sensor 14 and a microlens or the like that is not illustrated.

[Embodiment 3]

Figure 7:
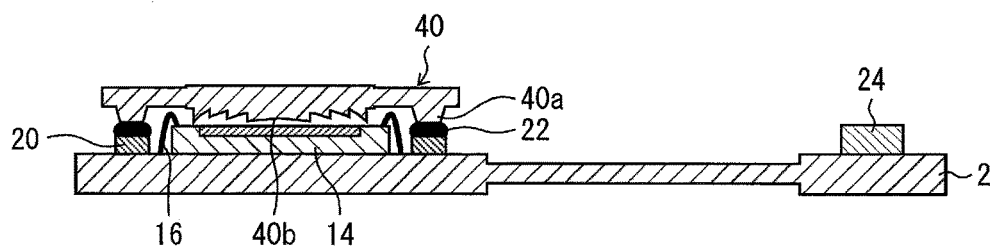
FIG. 7 is a cross-sectional view of an image surface-side group lens mounted over a sensor according to Embodiment 3 of the invention.

Embodiment 3 of the invention will be described as follows with reference to FIG. 7. Note that, for convenience of description, the same reference signs will be assigned to members having the same functions as those of the members described in the aforementioned embodiments and description thereof will be omitted.

In the present embodiment, there is a difference from the camera module 1 of Embodiment 1 in that a shape of an image surface-side group lens 40 is different.

The image surface-side group lens 40 according to the present embodiment has a foot portion 40a and a Fresnel lens portion 40b.

The foot portion 40a is provided in an edge portion, on a side opposing the sensor 14, of the image surface-side group lens 40. The foot portion 40a is preferably configured to protrude from two positions of the edge portion of the image surface-side group lens 40. The image surface-side group lens 40 has the foot portion 40a mounted on the fixed portion 2a of the FPC 2 via the resist 20 and the adhesive 22.

The Fresnel lens portion 40b is provided on an image surface side of the image surface-side group lens 40 and opposes the light-receiving surface of the sensor 14. The Fresnel lens portion 40b is configured by a Fresnel lens. With the configuration using the Fresnel lens, the image surface-side group lens 40 of the present embodiment is configured to be thinner compared to the image surface-side group lens of another embodiment.

Note that, as a modified example of Embodiment 3, the Fresnel lens portion 40b may be configured by a diffractive lens. Also in such a case, similarly to the configuration using the Fresnel lens, the image surface-side group lens 40 of the present embodiment is configured to be thinner compared to the image surface-side group lens of another embodiment.

[Embodiment 4]

Figure 8:
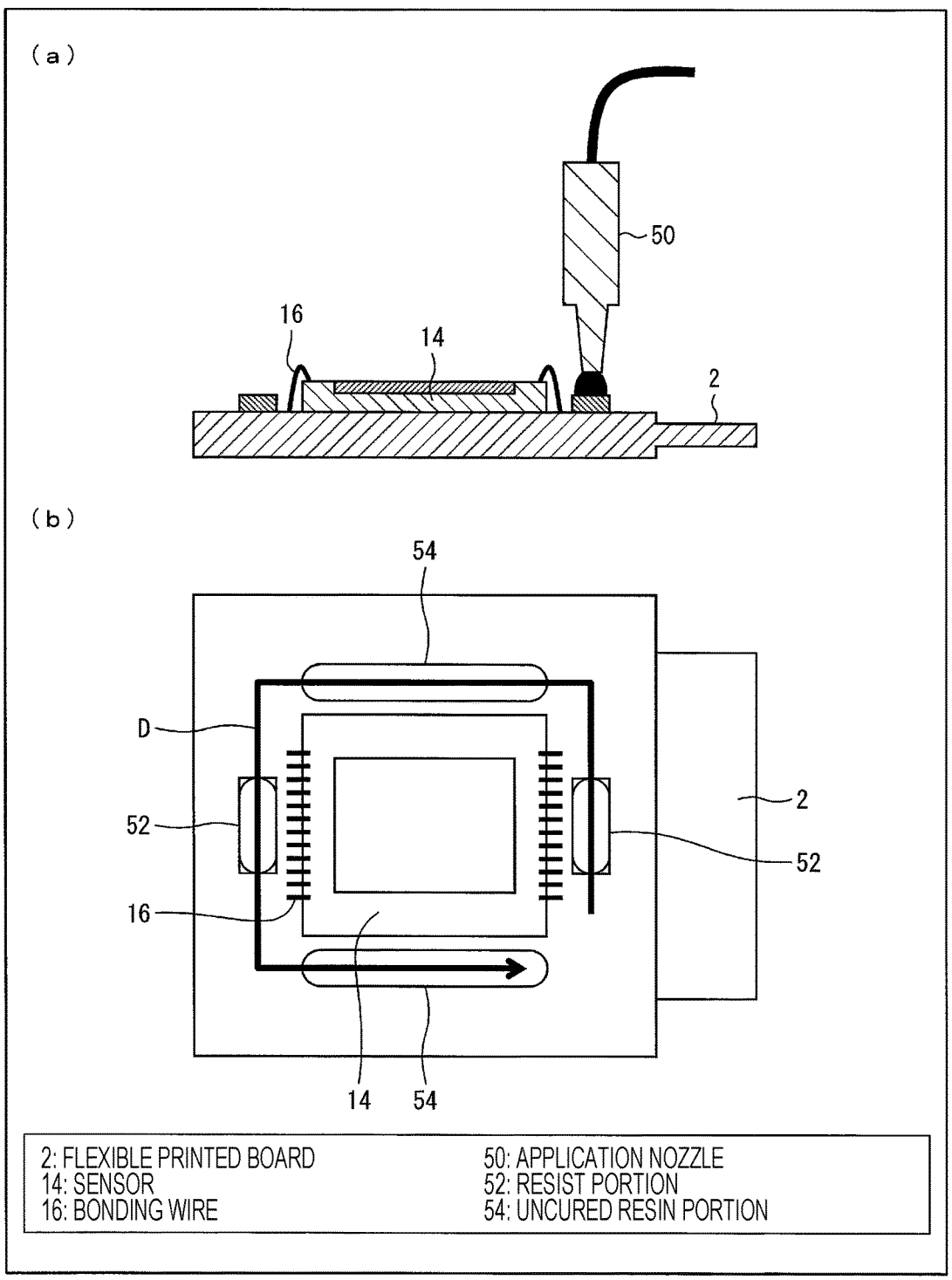
FIG. 8(a) is a cross-sectional view of an FPC according to Embodiment 4 when a resist solution is applied of the invention and FIG. 8(b) is a top view of the FPC according to Embodiment 4 of the invention.

Embodiment 4 of the invention will be described as follows with reference to FIG. 8. Note that, for convenience of description, the same reference signs will be assigned to members having the same functions as those of the members described in the aforementioned embodiments and description thereof will be omitted.

In the present embodiment, there is a difference from the camera module 1 of Embodiment 1 in that an uncured resin portion 54 that is not cured is formed at a periphery of a portion where the sensor 14 is provided in the FPC 2, in which the resist 20 is not formed.

The uncured resin portion 54 is formed by resins. A resist solution is used as an example of the resins in the present embodiment.

As illustrated in FIG. 8(a), the resist solution is applied, by an application nozzle (dispenser) 50, to a periphery of a portion where the sensor 14 is mounted in the FPC 2. As illustrated in FIG. 8(b), the application nozzle 50 moves along a movement path D around the portion where the sensor 14 is mounted.

The resist solution is applied at least to a resist portion 52 and the uncured resin portion 54 illustrated in FIG. 8(b).

After the image surface-side group lens is mounted, the resist solution that is applied to the resist portion 52 is cured and resist is provided. On the other hand, the resist solution that is applied to the uncured resin portion 54 is not cured even after the image surface-side group lens is mounted and has viscosity.

The resist solution is preferably a solution containing ultraviolet (UV) curing resin. In this case, after the image surface-side group lens is mounted, the resist portion 52 is sufficiently irradiated with ultraviolet rays for curing. On the other hand, even after the image surface-side group lens is mounted, the uncured resin portion 54 is not sufficiently irradiated with ultraviolet rays and is brought into an uncured state keeping viscosity.

When a foreign matter such as contamination is placed on the sensor 14, the camera module has impaired image quality because the foreign matter appears black. In the present embodiment, the uncured resin portion 54 functions to catch a foreign matter by viscosity and prevent entry of the foreign matter during an assembling process after the image surface-side group lens is mounted, and after a product is formed after assembling.

In the present embodiment, the uncured resin portion 54 is formed at a process of applying the resist solution to the resist portion 52. That is, in the present embodiment, it is possible to form a configuration for easily preventing entry of a foreign matter without requiring an additional process of forming a configuration for preventing entry of a foreign matter. The uncured resin portion 54 is configured not to be cured and thus does not contribute to warpage of the FPC 2 due to thermal expansion.

Note that, the uncured resin portion 54 is formed in a movement path D orthogonal to the movement path D in which the resist is formed in FIG. 8(b), but may be formed at any location along the movement path D other than the location where the resist is formed.

[Embodiment 5]

Figure 9:
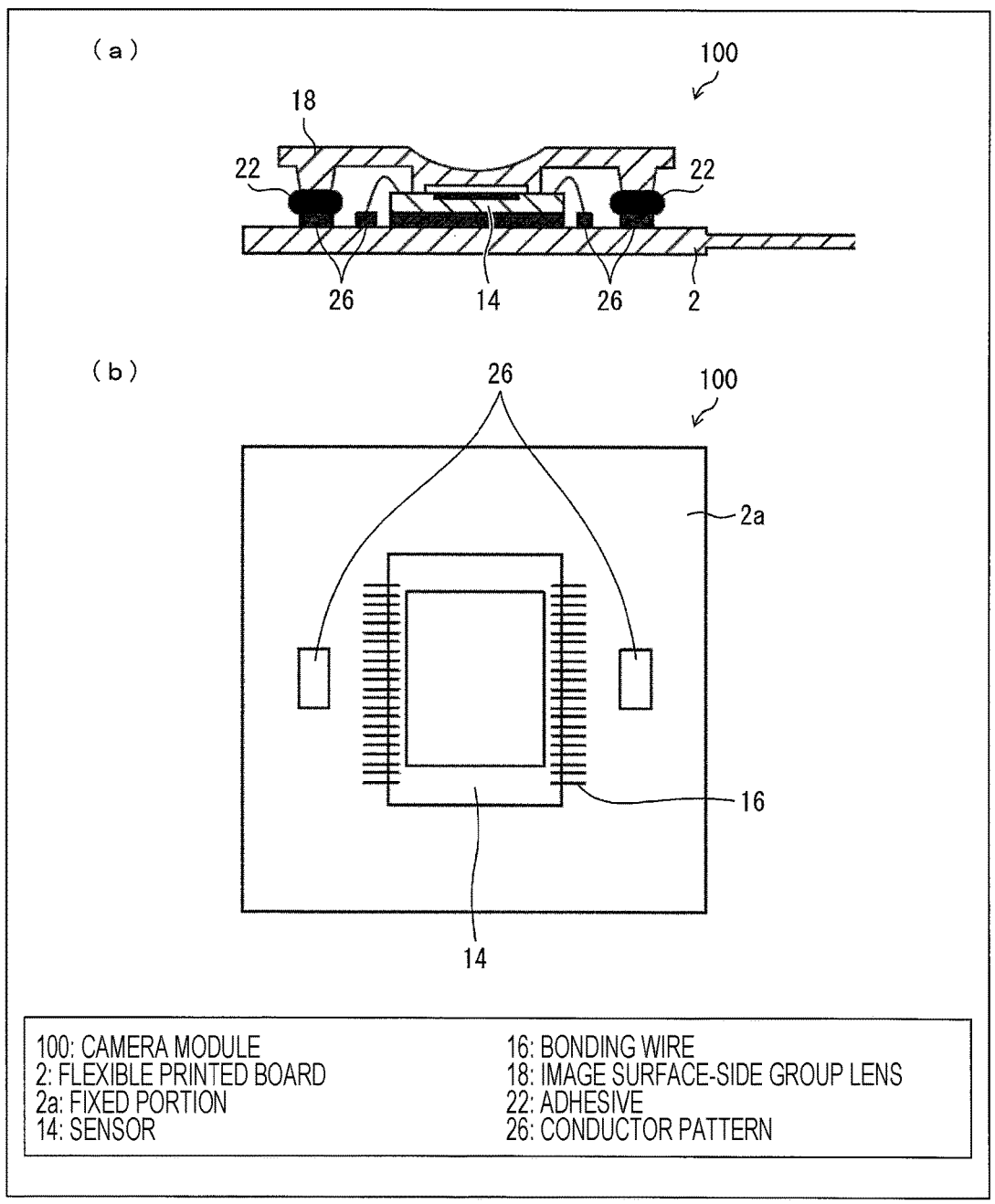
FIG. 9(a) is a cross-sectional view of an FPC according to Embodiment 5 of the invention and FIG. 9(b) is a top view of the FPC according to Embodiment 5 of the invention.

Embodiment 5 of the invention will be described as follows with reference to FIGS. 9 to 11. Note that, for convenience of description, the same reference signs will be assigned to members having the same functions as those of the members described in the aforementioned embodiments and description thereof will be omitted.

In the present embodiment, there is a difference from the camera module 1 of the aforementioned embodiments in that the adhesive is directly applied onto a conductor pattern 26 formed on the FPC 2 and the image surface-side group lens 18 is mounted on the FPC 2 only via the adhesive 22 as illustrated in FIG. 9(a).

The conductor pattern 26 illustrated in FIG. 9(b) is the conductor pattern 26 to which the adhesive 22 is applied. As illustrated in FIG. 9(b), the conductor pattern 26 to which the adhesive 22 is applied is locally formed on the substrate layer 2a2. Thus, similarly to the aforementioned embodiment, the adhesive 22 that is applied does not flow out of the conductor pattern 26 and a large amount of the adhesive 22 is not consumed, so that the height of the adhesive 22 is secured, thus making it possible to appropriately adjust the height from the FPC 2 to the image surface-side group lens 18 by the adhesive 22.

Figure 10:
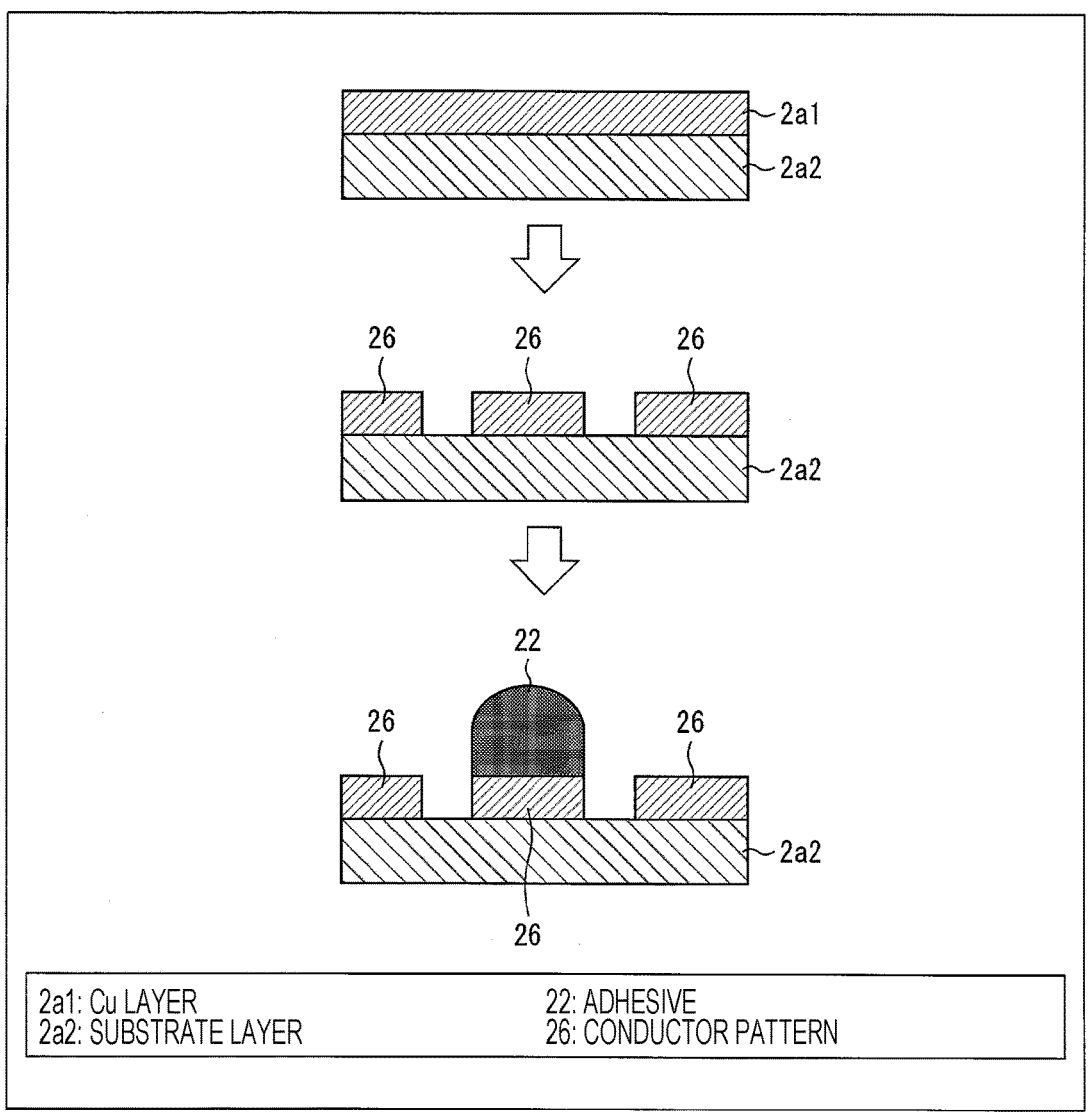
FIG. 10 illustrates a process of manufacturing the FPC according to Embodiment 5 of the invention.
Figure 11:
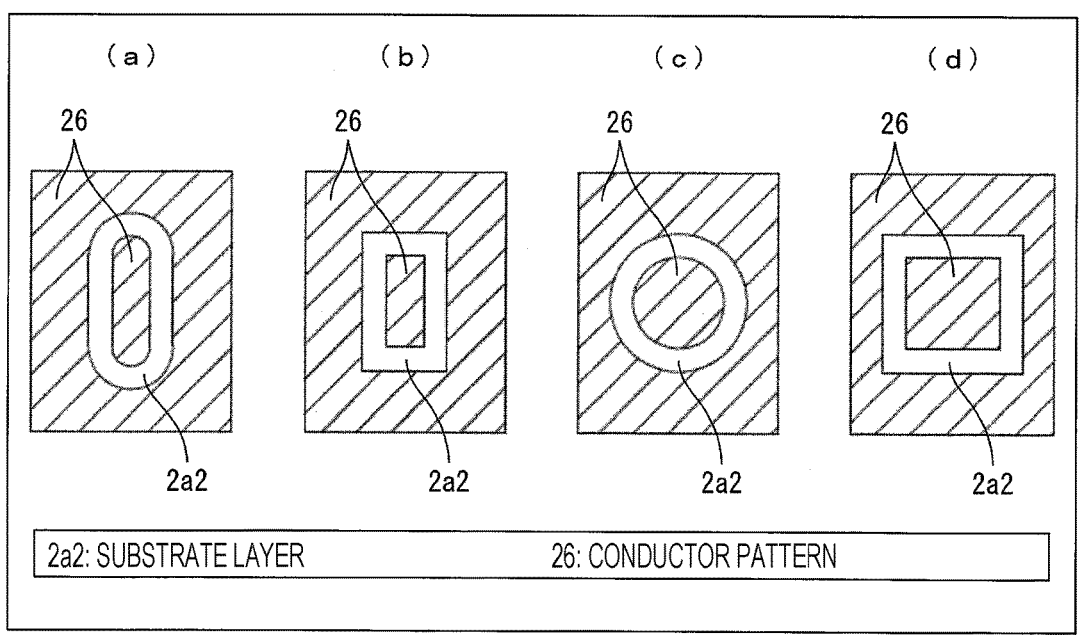
FIGS. 11(a) to 11(d) are schematic views each illustrating an example of a shape of a conductor pattern to which an adhesive is applied according to Embodiment 5 of the invention.

FIG. 10 illustrates a process of manufacturing the FPC 2 according to the present embodiment. First, the FPC 2 in which the Cu layer 2a1 is laminated on the substrate layer 2a2 is prepared. Next, the conductor pattern 26 is formed by performing etching for the Cu layer 2a1. Finally, the adhesive 22 is applied onto the conductor pattern 26. Note that, the conductor pattern 26 is formed by removing, through the etching, an unnecessary portion of the Cu layer 2a1 laminated on the substrate layer 2a2 in the present embodiment, but may be formed by removing the unnecessary portion of the Cu layer 2a1 with another method. The conductor pattern 26 may not be formed by removing the unnecessary portion from the Cu layer 2a1 and may be directly formed by printing, plating, or the like.

FIGS. 11(a) to 11(d) each illustrates an example of a shape of the conductor pattern 26. As illustrated in FIG. 11(a), the conductor pattern 26 in an elliptical shape that is divided by a groove formed by performing etching of the Cu layer 2a1 into an elliptical shape may be formed. As illustrated in FIG. 11(b), the conductor pattern 26 in a rectangular shape that is divided by a groove formed by performing etching of the Cu layer 2a1 into a rectangular shape may be formed. As illustrated in FIG. 11(c), the conductor pattern 26 in a circular shape that is divided by a groove formed by performing etching of the Cu layer 2a1 into a circular shape may be formed. As illustrated in FIG. 11(d), the conductor pattern 26 in a square shape that is divided by a groove formed by performing etching of the Cu layer 2a1 into a square shape may be formed.

The conductor pattern 26 is able to be formed more finely than the resist formed through application. Thus, compared to the aforementioned embodiments, it is possible to further reduce a size of the FPC 2 and further miniaturize the camera module 1.

[Embodiment 6]

Figure 12:
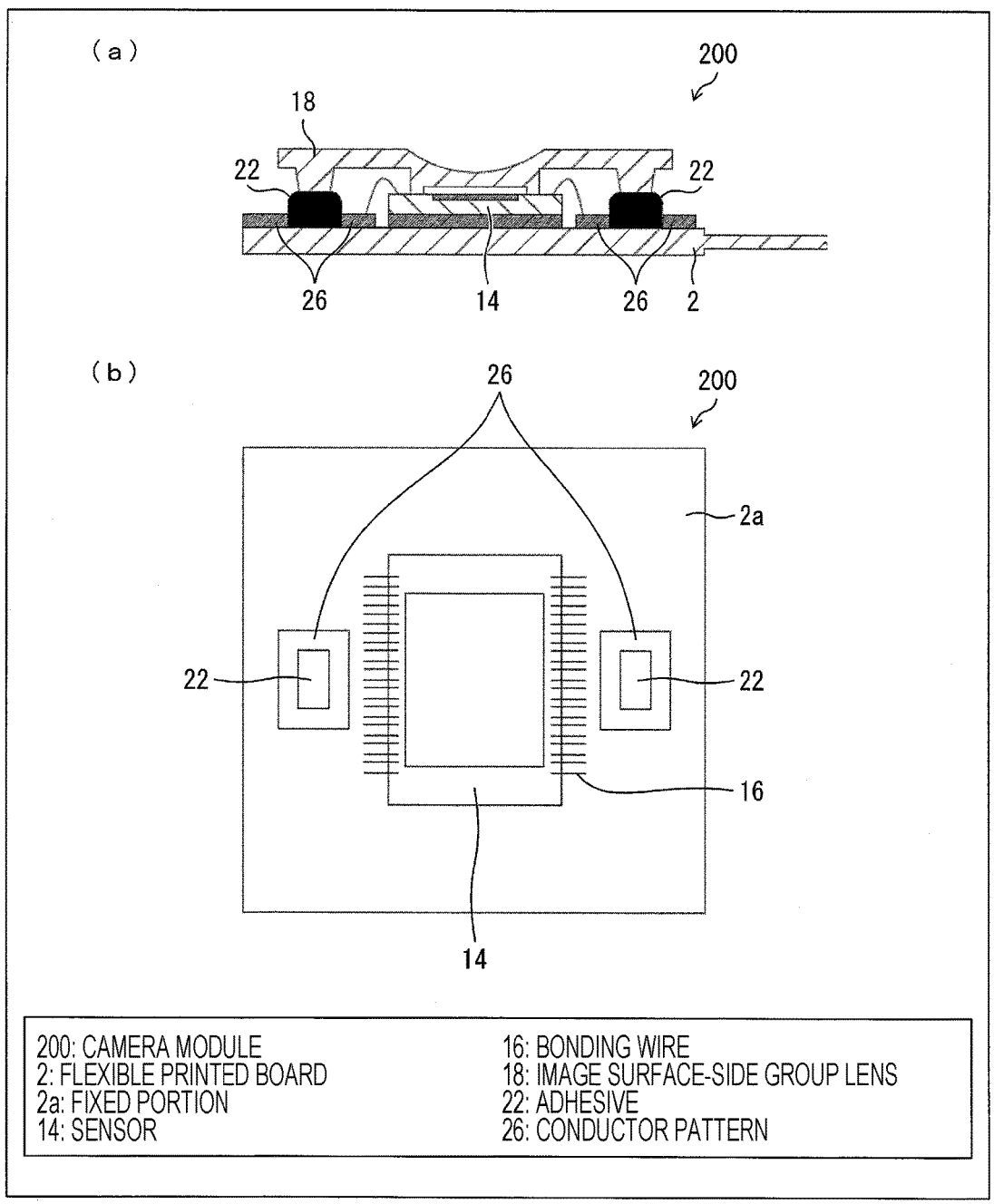
FIG. 12(a) is a cross-sectional view of an FPC according to Embodiment 6 of the invention and FIG. 12(b) is a top view of the FPC according to Embodiment 6 of the invention.

Embodiment 6 of the invention will be described as follows with reference to FIGS. 12 to 14. Note that, for convenience of description, the same reference signs will be assigned to members having the same functions as those of the members described in the aforementioned embodiments and description thereof will be omitted.

In the present embodiment, as illustrated in FIG. 12(a), there is a difference from the camera module of the aforementioned embodiments in that the adhesive 22 is applied to a groove (exposed portion of the substrate layer 2a2) in the conductor pattern 26 that is formed on the FPC 2 and the image surface-side group lens 18 is mounted on the FPC 2 via the adhesive 22.

FIG. 12(b) illustrates the conductor pattern 26 and the adhesive 22 applied to the groove in the conductor pattern 26. As illustrated in FIG. 12(b), the groove in the conductor pattern 26 is locally formed on the substrate layer 2a2. Thus, similarly to the aforementioned embodiments, a large amount of the adhesive 22 is not consumed and the height of the adhesive 22 is able to be secured, thus making it possible to appropriately adjust the height from the FPC 2 to the image surface-side group lens 18 by the adhesive 22.

Figure 13:
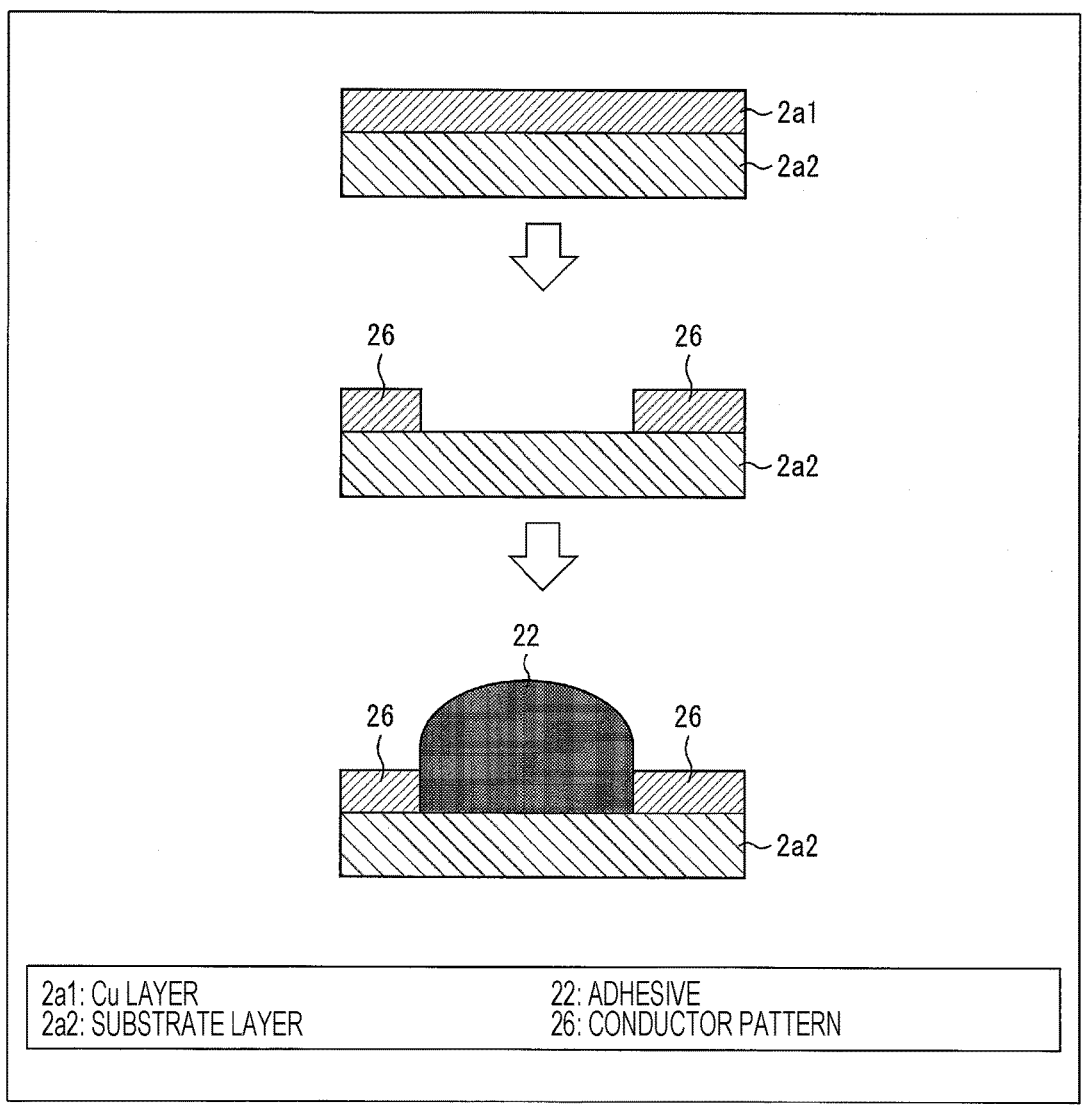
FIG. 13 illustrates a process of manufacturing the FPC according to Embodiment 6 of the invention.
Figure 14:
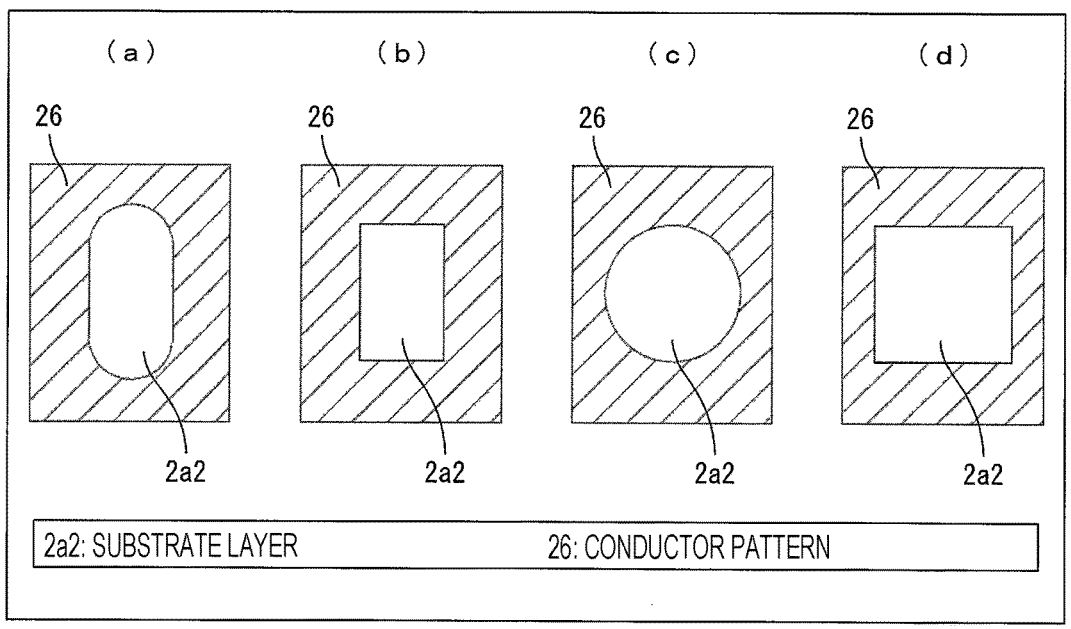
FIGS. 14(a) to 14(d) are schematic views each illustrating an example of a shape of a conductor pattern to which an adhesive is applied according to Embodiment 6 of the invention.

FIG. 13 illustrates a process of manufacturing the FPC 2 according to the present embodiment. First, the FPC 2 in which the Cu layer 2a1 is laminated on the substrate layer 2a2 is prepared. Next, the conductor pattern 26 is formed by performing etching for the Cu layer 2a1. Finally, the adhesive 22 is applied to the groove in the conductor pattern 26. Note that, the conductor pattern 26 is formed by removing, through the etching, an unnecessary portion of the Cu layer 2a1 laminated on the substrate layer 2a2 in the present embodiment as well, but may be formed by removing the unnecessary portion of the Cu layer 2a1 with another method. The conductor pattern 26 may not be formed by removing the unnecessary portion from the Cu layer 2z1 and may be directly formed by printing, plating, or the like.

FIGS. 14(a) to 14(d) each illustrates an example of a shape of the conductor pattern 26. As illustrated in FIG. 14(a), a groove (an exposed portion of the substrate layer 2a2, i.e. a portion to which the adhesive 22 is applied) in an elliptical shape may be formed by performing etching for the Cu layer 2a1 into an elliptical shape. As illustrated in FIG. 14(b), a groove in a rectangular shape may be formed by performing etching for the Cu layer 2a1 into a rectangular shape. As illustrated in FIG. 14(c), a groove in a circular shape may be formed by performing etching for the Cu layer 2a1 into a circular shape. As illustrated in FIG. 14(d), a groove in a square shape may be formed by performing etching for the Cu layer 2a1 into a square shape.

Note that, the adhesive 22 is applied to the groove in the conductor pattern 26 in the present embodiment. Instead, the adhesive 22 may be applied to a groove formed by the resist. The groove may be formed in such a manner that the resist is applied at least to a periphery of a portion serving as the groove on the FPC 2 to form a resist layer and a portion of the resist layer corresponding to the groove is removed, or the groove may be formed by applying the resist along a shape of an edge of the groove.

[Embodiment 7]

Figure 15:
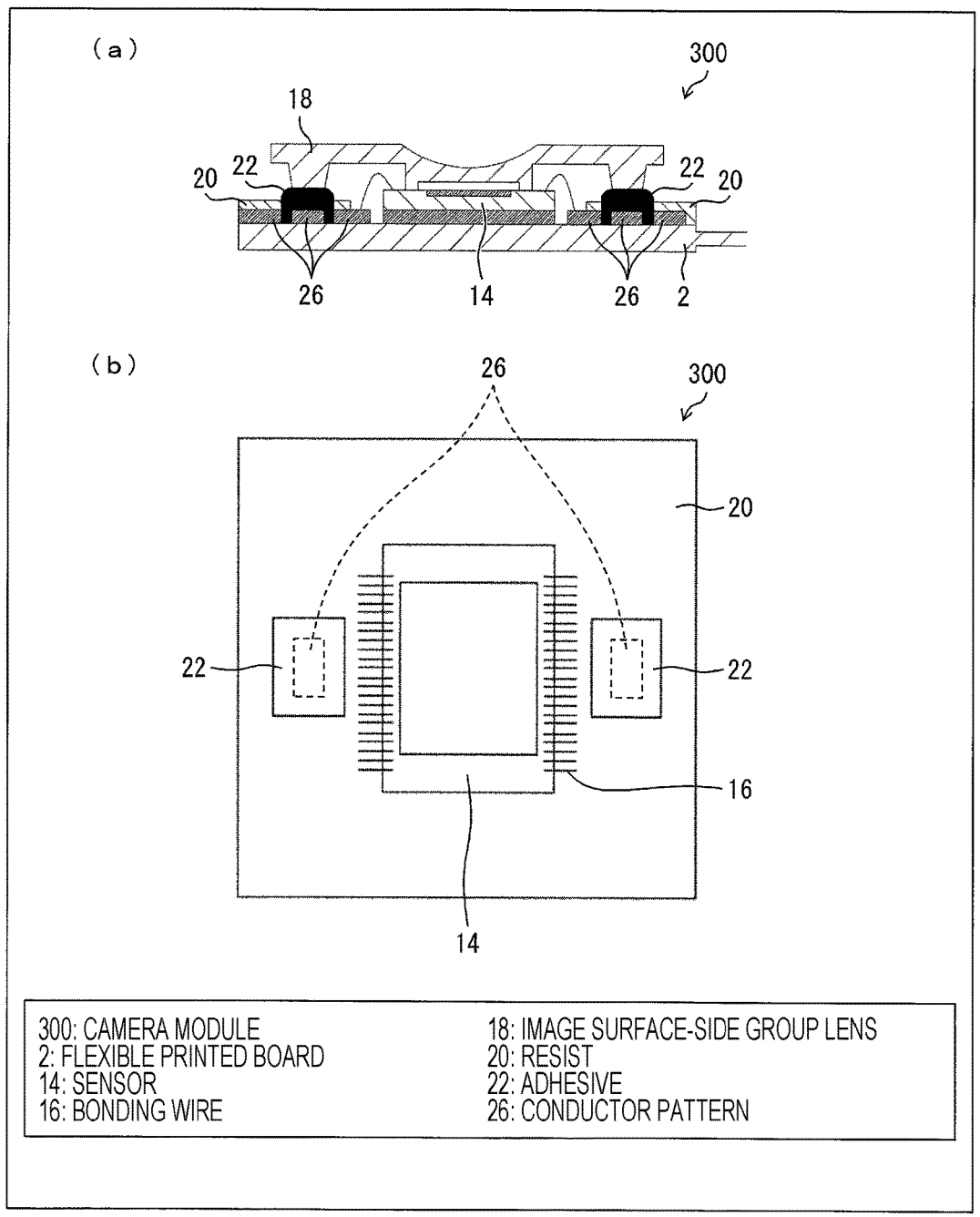
FIG. 15(a) is a cross-sectional view of an FPC according to Embodiment 7 of the invention and FIG. 15(b) is a top view of the FPC according to Embodiment 7 of the invention.

Embodiment 7 of the invention will be described as follows with reference to FIGS. 15 to 17. Note that, for convenience of description, the same reference signs will be assigned to members having the same functions as those of the members described in the aforementioned embodiments and description thereof will be omitted.

In the present embodiment, there is a difference from the camera module of Embodiment 6 in that the adhesive 22 is applied so as to cover the conductor pattern 26 as illustrated in FIG. 15(a). There is also a difference from the camera module of Embodiment 6 in that the resist 20 is provided on the conductor pattern 26 by which the groove is formed.

FIG. 15(b) illustrates the adhesive 22 applied to the groove in the conductor pattern 26 and the conductor pattern 26 arranged inside of the adhesive 22. As illustrated in FIG. 15(b), the groove to which the adhesive 22 is applied is locally formed on the substrate layer 2a2. Thus, similarly to the aforementioned embodiments, a large amount of the adhesive 22 is not consumed and the height of the adhesive 22 is able to be secured, thus making it possible to appropriately adjust the height from the FPC 2 to the image surface-side group lens 18 by the adhesive 22.

When the conductor pattern 26 is arranged inside of the adhesive 22 as illustrated in FIGS. 15(a) and (b), the amount of the adhesive 22 to be applied is able to be reduced compared to Embodiment 6.

Figure 16:
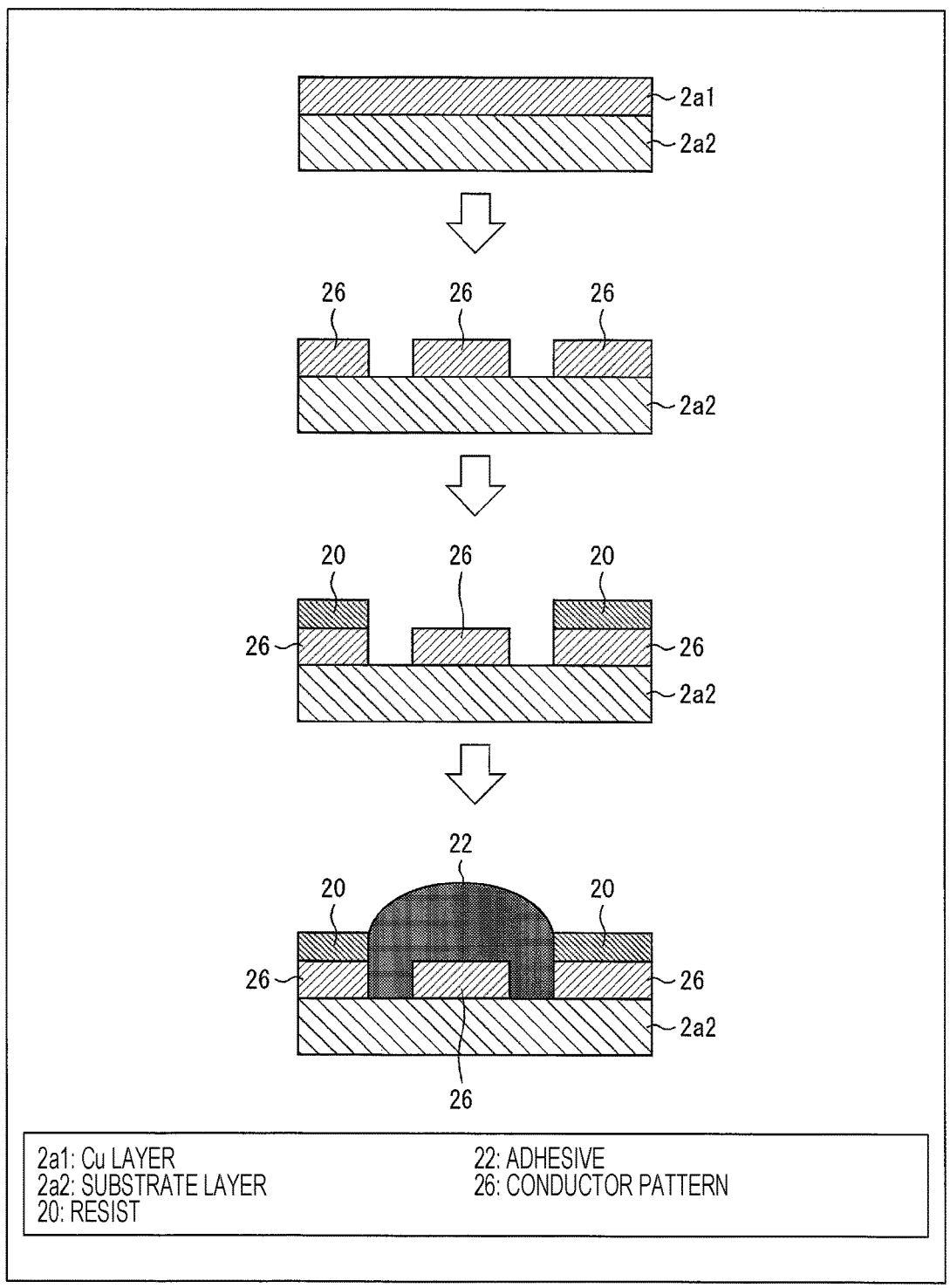
FIG. 16 illustrates a process of manufacturing the FPC according to Embodiment 7 of the invention.
Figure 17:
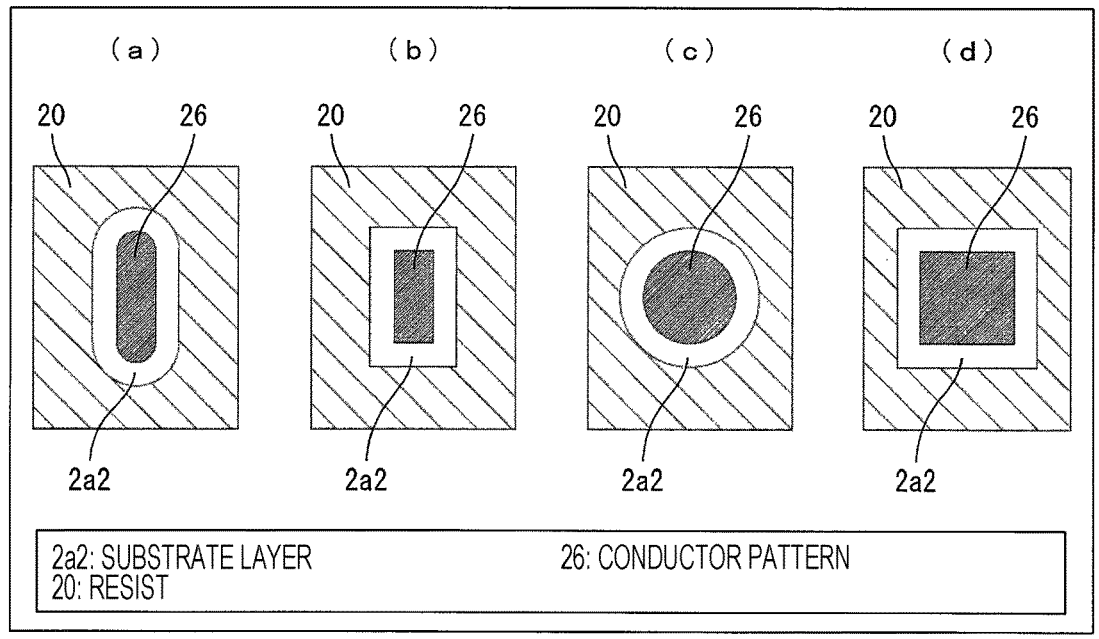
FIGS. 17(a) to 17(d) are schematic views each illustrating an example of a shape of a conductor pattern to which an adhesive is applied according to Embodiment 7 of the invention.

FIG. 16 illustrates a process of manufacturing the FPC 2 according to the present embodiment. First, the FPC 2 in which the Cu layer 2a1 is laminated on the substrate layer 2a2 is prepared. Next, the conductor pattern 26 is formed by performing etching for the Cu layer 2a1. Finally, the adhesive 22 is applied so as to cover the conductor pattern 26 formed within the groove in the conductor pattern 26. Note that, the conductor pattern 26 is formed by removing, through the etching, an unnecessary portion of the Cu layer 2a1 laminated on the substrate layer 2a2 in the present embodiment as well, but may be formed by removing the unnecessary portion of the Cu layer 2a1 with another method. The conductor pattern 26 may not be formed by removing the unnecessary portion from the Cu layer 2z1 and may be directly formed by printing, plating, or the like.

FIGS. 17(a) to 17(d) each illustrates an example of a shape of the conductor pattern 26 and a shape of the resist 20 that covers the conductor pattern 26. As illustrated in FIG. 17(a), the Cu layer 2a1 may be subjected to etching into an elliptical shape so that an island of the conductor pattern 26 in an elliptical shape remains inside, and the resist 20 may be provided so as to cover the conductor pattern 26 around a groove in an elliptical shape. As illustrated in FIG. 17(b), the Cu layer 2a1 may be subjected to etching into a rectangular shape so that an island of the conductor pattern 26 in a rectangular shape remains inside, and the resist 20 may be provided so as to cover the conductor pattern 26 around a groove in a rectangular shape. As illustrated in FIG. 17(c), the Cu layer 2a1 may be subjected to etching into a circular shape so that an island of the conductor pattern 26 in a circular shape remains inside, and the resist 20 may be provided so as to cover the conductor pattern 26 around a groove in a circular shape. As illustrated in FIG. 17(d), the Cu layer 2a1 may be subjected to etching into a square shape so that an island of the conductor pattern 26 in a square shape remains inside, and the resist 20 may be provided so as to cover the conductor pattern 26 around a groove in a square shape.

Note that, though the resist 20 is provided on the conductor pattern 26 in the present embodiment, the resist 20 may not be provided. The groove may be formed only by a resist, and in such a case, the resist may be provided also in the groove and an adhesive may be applied so as to cover the resist in the grove. A method for forming the grove formed only by the resist may be similar to that of Embodiment 6.

[Embodiment 8]

Embodiment 8 of the invention will be described as follows with reference to FIGS. 18 and 19. Note that, for convenience of description, the same reference signs will be assigned to members having the same functions as those of the members described in the aforementioned embodiments and description thereof will be omitted.

Figure 18:
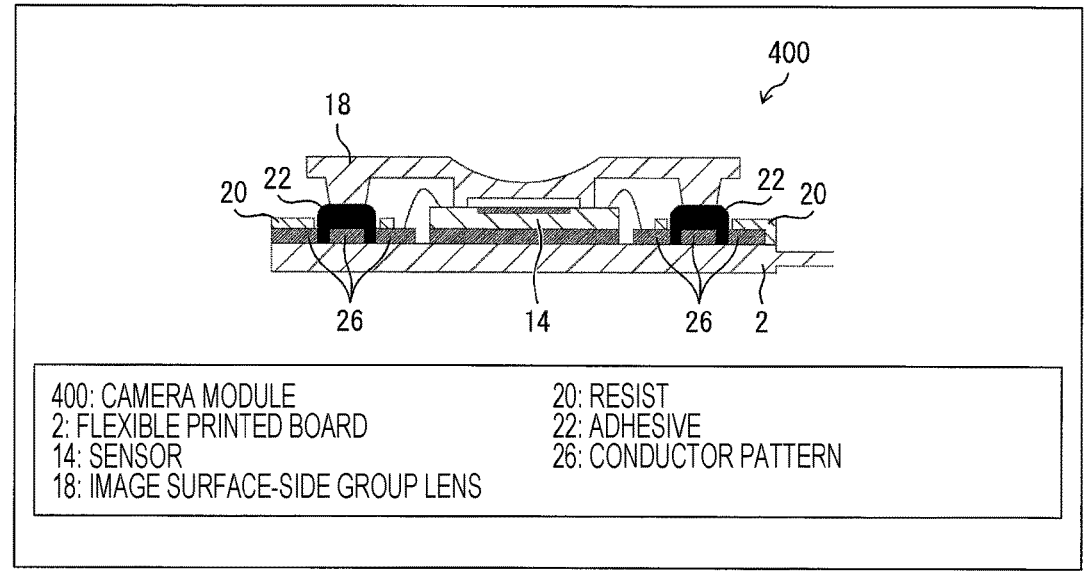
FIG. 18 is a cross-sectional view of an FPC according to Embodiment 8 of the invention.
Figure 19:
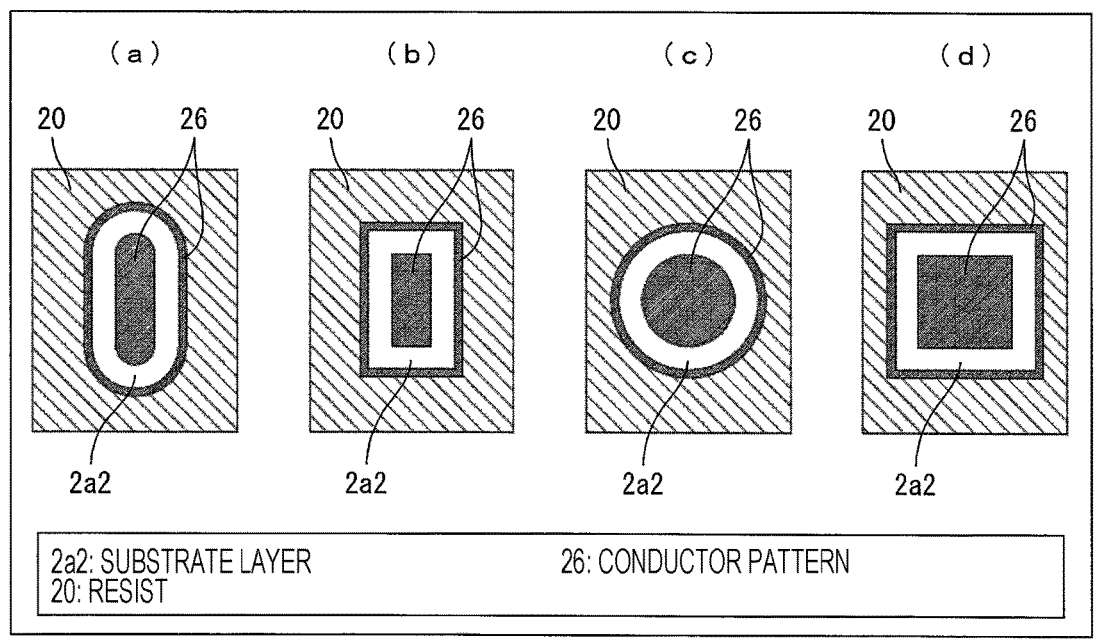
FIGS. 19(a) to 19(d) are schematic views each illustrating an example of a shape of a conductor pattern to which an adhesive is applied according to Embodiment 8 of the invention.

The present embodiment is different from Embodiment 7 in that the resist 20 is provided so that the groove in the resist 20 is greater than the groove in the conductor pattern 26 and an edge of the groove in the resist 20 is positioned on outer peripheral portion with respect to an edge of the groove in the conductor pattern 26 relative to a portion to which the adhesive 22 is applied as illustrated in FIG. 18.

In the present embodiment, a corner that is formed between the edge of the conductor pattern 26 and the edge of the resist 20 makes it possible to prevent the adhesive 22 from riding on a periphery of the groove, for example, when the adhesive 22 is excessively applied.

FIGS. 19(a) to 19(d) each illustrates an example of a shape of the conductor pattern 26 and a shape of the resist 20 that covers the conductor pattern 26. As illustrated in FIG. 19(a), the Cu layer 2a1 may be subjected to etching into an elliptical shape so that an island of the conductor pattern 26 in an elliptical shape remains inside, and the resist 20 may be provided so that the conductor pattern 26 around a groove in an elliptical shape has an edge exposed. As illustrated in FIG. 19(b), the Cu layer 2a1 may be subjected to etching into a rectangular shape so that an island of the conductor pattern 26 in a rectangular shape remains inside, and the resist 20 may be provided so that the conductor pattern 26 around a groove in a rectangular shape has an edge exposed. As illustrated in FIG. 19(c), the Cu layer 2a1 may be subjected to etching into a circular shape so that an island of the conductor pattern 26 in a circular shape remains inside, and the resist 20 may be provided so that the conductor pattern 26 around a groove in a circular shape has an edge exposed. As illustrated in FIG. 19(d), the Cu layer 2a1 may be subjected to etching into a square shape so that an island of the conductor pattern 26 in a square shape remains inside, and the resist 20 may be provided so that the conductor pattern 26 around a groove in a square shape has an edge exposed.

[Embodiment 9]

Embodiment 9 of the invention will be described as follows with reference to FIG. 20. Note that, for convenience of description, the same reference signs will be assigned to members having the same functions as those of the members described in the aforementioned embodiments and description thereof will be omitted.

Figure 20:
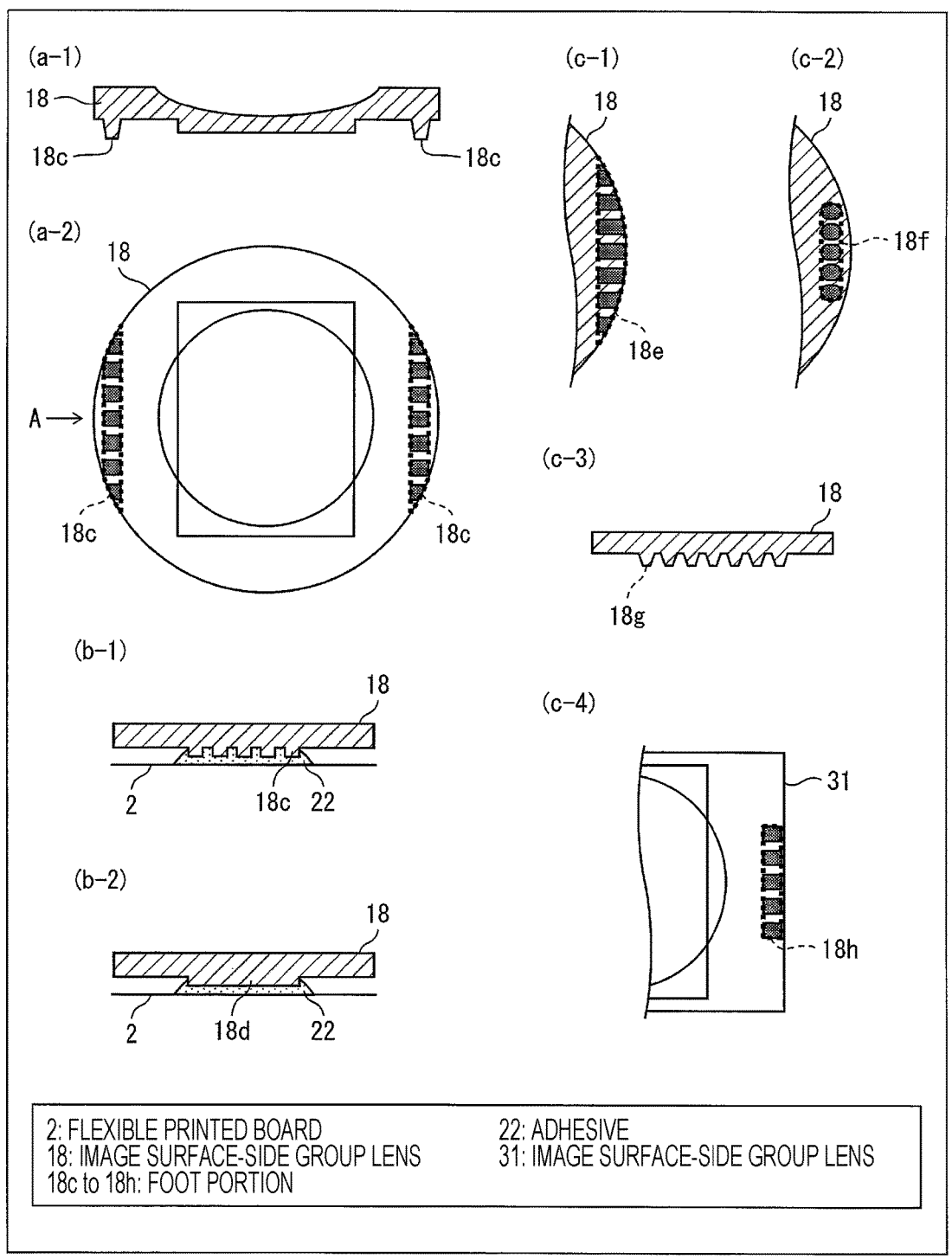
FIG. 20 is an illustration of a foot portion of an image surface-side group lens according to Embodiment 9 of the invention.

FIG. 20(a-1) is a cross-sectional view of the image surface-side group lens 18 according to the present embodiment and FIG. 20(a-2) is a top view of the image surface-side group lens 18 according to the present embodiment.

As illustrated in FIG. 20(a-2), a contact surface in which a foot portion 18c of the image surface-side group lens 18 according to the present embodiment contacts the adhesive 22 may have unevenness in a comb-tooth shape. The contact surface having unevenness makes it possible to increase a contact area of the foot portion 18c and the adhesive 22.

FIG. 20(b-1) is a projection drawing of the image surface-side group lens 18 when observed from a direction indicated with A of FIG. 20(a-2). Meanwhile, FIG. 20(b-2) is a projection drawing of the image surface-side group lens 18 in which a contact surface of a foot portion 18d does not have unevenness. As found from comparison of FIG. 20(b-1) to FIG. 20(b-2), the contact surface that has unevenness has a larger contact area of the foot portion and the adhesive 22 and a greater adhesive strength between the foot portion 18c and the adhesive 22 than those of the contact surface that does not have unevenness.

Note that, the shape, roughness, uniformity, and the like of the unevenness of the contact surface are not limited to any aspect and the contact surface is only required to have a large contact area. FIGS. 20(c-1) to (c-3) illustrate other examples of unevenness.

As illustrated in FIG. 20(c-1), longer unevenness than the unevenness illustrated in FIG. 20(a-2) may be provided by extending a foot portion 18e to the edge of the image surface-side group lens 18. This makes it possible to further increase the contact area and further increase an adhesive strength between the foot portion e and the adhesive 22.

As illustrated in FIG. 20(c-2), a foot portion 18f may have a rounded convex portion. This makes it possible to achieve excellent processability of unevenness.

As illustrated in FIG. 20(c-3), a foot portion 18g may have an inclined convex portion. This makes it possible to achieve excellent processability of unevenness.

Moreover, an image surface-side group lens 31 may have a quadrangular external form. This makes it possible to reduce a size of a camera module on which the image surface-side group lens 31 is mounted. Note that, a foot portion 18h may be extended toward the inner inside from the edge of the image surface-side group lens as illustrated in FIG. 20(c-1) or may have a rounded convex portion as illustrated in FIG. 20(c-2).

Note that, the contact surface where the foot portion and the adhesive contact with each other may have unevenness also in other embodiments described above.

CONCLUSION

A camera module 1, 100, 200, 300, or 400 according to an aspect 1 of the invention is a camera module 1 including a sensor 14 mounted on a board (FPC 2) and an image surface-side lens (image surface-side group lens 18) arranged on the sensor 14, in which the image surface-side lens (image surface-side group lens 18) is mounted on the board with an organic substance member (adhesive 22) being interposed between the board (FPC 2) and an edge portion of the image surface-side lens (image surface-side group lens 18) on a side opposing the sensor 14.

According to the aforementioned configuration, the image surface-side lens (image surface-side group lens 18) is able to be mounted on the board (FPC 2) by appropriately adjusting a height from the board (FPC 2) to the image surface-side lens (image surface-side group lens 18).

In the camera module 1 according to an aspect 2 of the invention, the board (FPC 2) may be a flexible printed board and the organic substance member (adhesive 22) may be provided between the edge portion and a cured organic substance member (resist 20) that is locally provided on the board (FPC 2) opposing the edge portion in the aspect 1 or 2.

According to the aforementioned configuration, even when the flexible printed board 2 that allows highly dense mounting is used, it is possible to suppress warpage due to thermal expansion. In addition, since the organic substance member (adhesive 22) is applied to the cured organic substance member (resist 20) that is locally formed and has an island-like shape, the organic substance member (adhesive 22) that is applied does not flow outside of the island of the cured organic substance member (resist 20). Thus, a height of the organic substance member (adhesive 22) is able to be secured without consuming a large amount of the organic substance member (adhesive 22).

In the camera module 1 according to an aspect 3 of the invention, the cured organic substance member (resist 20) may be a resist in the aspect 2.

According to the aforementioned configuration, the cured organic substance member (resist 20) is able to be easily deposited on the board (FPC 2).

In the camera module 100, 200, 300, or 400 according to an aspect 4 of the invention, the board (FPC 2) may be a flexible printed board, at least an outermost layer of a surface on which the sensor 14 is mounted may be a metal layer (Cu layer 2a1) in which a pattern (conductor pattern 26) is formed, and the organic substance member (adhesive 22) may be provided in accordance with a shape of the pattern (conductor pattern 26) in the aspect 1.

According to the aforementioned configuration, since the pattern (conductor pattern 26) is able to be finely formed, an amount of the organic substance member (adhesive 22) that is provided in accordance with the shape of the pattern (conductor pattern 26) is able to be reduced.

In the camera module 100 according to an aspect 5 of the invention, the organic substance member (adhesive 22) may be provided on at least a part of the pattern (conductor pattern 26) in the aspect 4.

According to the aforementioned configuration, since the pattern (conductor pattern 26) is able to be finely formed, an area in which the organic substance member (adhesive 22) is provided becomes narrow, and the height from the board (FPC 2) to the image surface-side lens (image surface-side group lens 18) is able to be appropriately adjusted with a small amount of the organic substance member (adhesive 22).

In the camera module 200 according to an aspect 6 of the invention, the organic substance member (adhesive 22) may be provided to be surrounded by the pattern (conductor pattern 26) in the aspect 4.

According to the aforementioned configuration, since a gap between portions at which the pattern (conductor pattern 26) is provided is able to be finely formed, an area in which the organic substance member (adhesive 22) is provided becomes narrow, and the height from the board (FPC 2) to the image surface-side lens (image surface-side group lens 18) is able to be appropriately adjusted with a small amount of the organic substance member (adhesive 22).

In the camera module 300 or 400 according to an aspect 7 of the invention, the organic substance member (adhesive 22) may be provided to surround the pattern (conductor pattern 26) in the aspect 6.

According to the aforementioned configuration, it is possible to further reduce an amount of the organic substance member (adhesive 22).

In the camera module 1, 100, 200, 300, or 400 according to an aspect 8 of the invention, the edge portion may have a foot portion 18a, 30a, or 40a and the organic substance member (adhesive 22) may be provided between the foot portion 18a, 30a, or 40a and a portion of the board (FPC 2), which corresponds to a position of the foot portion 18a, 30a, or 40a in any one of the aspects 1 to 7.

According to the aforementioned configuration, a gap between the edge portion and the board (FPC 2) is filled by the foot portion 18a, 30a, or 40a.

In the camera module 1, 100, 200, 300, or 400 according to an aspect 9 of the invention, a portion of the foot portion 18a, 30a, or 40a, in which the organic substance member (adhesive 22) is provided, may have unevenness in the aspect 8.

According to the aforementioned configuration, a contact area of the foot portion 18a, 30a, or 40a and the organic substance member (adhesive 22) is able to be increased, and stronger adhesiveness between the foot portion 18a, 30a, or 40a and the organic substance member (adhesive 22) is able to be achieved compared to a case where a contact surface between the foot portion 18a, 30a, or 40a and the organic substance member (adhesive 22) does not have unevenness.

The camera module 1, 100, 200, 300, or 400 according to an aspect 10 of the invention may further include an actuator 12 on an object side of the image surface-side lens (image surface-side group lens 18), in which the image surface-side lens (image surface-side group lens 18) may be bonded to the actuator 12 in any one of the aspects 1 to 9.

According to the aforementioned configuration, even when a sectional area of the foot portion 18a is particularly small and a fixing strength between the image surface-side group lens 18 and the board (FPC 2) is low, the image surface-side group lens 18 is able to be fixed to the camera module 1 with high strength.

In the camera module 1, 100, 200, 300, or 400 according to an aspect 11 of the invention, the image surface-side lens (image surface-side group lens 18) may be an image surface-side group lens having negative refractivity in any one of the aspects 1 to 10.

According to the aforementioned configuration, it is possible to appropriately correct curvature of the image surface.

The camera module 1, 100, 200, 300, or 400 according to an aspect 12 of the invention may further include an object-side group lens 10 on the object side of the image surface-side group lens 18, in which at least either an autofocus operation or an image stabilization operation may be performed in accordance with displacement of the object-side group lens 10 in the aspect 11.

According to the aforementioned configuration, it is possible to perform at least one of achieving focusing at various image capturing distances and control for image stabilization.

In the camera module 1, 100, 200, 300, or 400 according to an aspect 13 of the invention, the image surface-side lens (image surface-side group lens 18) may have a contact surface 18b in contact with the sensor 14 in any one of the aspects 1 to 12.

According to the aforementioned configuration, a position and an inclination of an optical axis direction of the image surface-side lens (image surface-side group lens 18) are able to be appropriately determined with the sensor 14 used as a reference.

In the camera module 1, 100, 200, 300, or 400 according to an aspect 14 of the invention, the image surface-side lens (image surface-side group lens 18) may have a protrusion portion 30c at a portion corresponding to a periphery of a light-receiving surface of the sensor 14 and a portion of the image surface-side lens, which corresponds to the light-receiving surface of the sensor 14, may not be in contact with the sensor 14 in any one of the aspects 1 to 12.

According to the aforementioned configuration, it possible to prevent damages to the light-receiving surface of the sensor 14 and a microlens or the like.

In the camera module 1, 100, 200, 300, or 400 according to an aspect 15 of the invention, an uncured resin portion 54 that is not cured may be formed at a peripheral portion of the sensor 14 on the board (FPC 2), where the organic substance member (adhesive 22) is not provided, in any one of the aspects 1 to 14.

According to the aforementioned configuration, the uncured resin portion 54 is able to catch a foreign matter by viscosity and prevent entry of the foreign matter during assembling process after the image surface-side lens (image surface-side group lens 18) is mounted, and after a product is formed after assembling.

A flexible printed board 2 according to an aspect 16 of the invention includes a substrate layer 2a2 or 2a3 and a metal layer (Cu layer 2a1 or 2a4) on each of one surface side and another surface side, in which areas of the substrate layers 2a2 and 2a3 are substantially equal to each other and areas of the metal layers (Cu layers 2a1 and 2a4) are substantially equal to each other on the one surface side and the other surface side, and an organic substance member (resist 20) that is a deposited organic substance material is locally provided.

According to the aforementioned configuration, it is possible to suppress warpage of the FPC 2 and easily adjust the height of a component to be mounted. In particular, the organic substance member (resist 20) being locally deposited makes it possible to perform minor adjustment of the height that is not able to be realized through injection molding or the like.

The invention is not limited to the embodiments described above, and may be modified in various manners within the scope of the claims, and an embodiment achieved by appropriately combining technical means disclosed in different embodiments is also encompassed in the technical scope of the invention. Further, by combining the technical means disclosed in each of the embodiments, a new technical feature may be formed.

INDUSTRIAL APPLICABILITY

The invention is able to be used for electronic equipment and a flexible printed board on which electronic equipment is mounted.

REFERENCE SIGNS LIST 1 camera module
2, 5 flexible printed board (board)
2a fixed portion
2a1, 2a4, 2b1, 2b3 Cu layer (metal layer)
2a2, 2a3 substrate layer
2b variable portion
2b2 polyimide layer
6 resist
10 object-side group lens
12 actuator
14 sensor
16 bonding wire
18, 30, 40 image surface-side group lens (image surface-side lens)
18a, 30a, 40a foot portion
18b contact surface
19 adhesive
20 resist (cured organic substance member)
24 connector
22 adhesive (organic substance member)
26 conductor pattern (pattern)
30b opposing surface
30c protrusion portion
40b Fresnel lens portion
50 application nozzle
52 resist portion
54 uncured resin portion
D movement path

The invention claimed is:

1. A camera module comprising:
a sensor mounted on a flexible printed board; and
an image surface-side lens arranged on the sensor, wherein:
the sensor and the image surface-side lens are in contact with each other,
the image surface-side lens is mounted on the flexible printed board with an organic substance member being interposed between the flexible printed board and an edge portion of the image surface-side lens on a side opposing the sensor, and
the organic substance member is provided on an island-shaped resist that is on the flexible printed board.

2. The camera module according to claim 1, further comprising:
a bonding wire that electrically connects the sensor and the flexible printed board to each other, wherein
the sensor includes a surface with a first portion in contact with the image surface-side lens, the first portion being closer to a center of the surface than a second portion of the surface of the sensor at which the sensor is connected to the bonding wire.

3. The camera module according to claim 1, wherein at least an outermost layer of a surface of the flexible printed board on which the sensor is mounted is a metal layer in which a pattern is defined, and the organic substance member is provided in accordance with a shape of the pattern.

4. The camera module according to claim 3, wherein the organic substance member is provided on at least a portion of the pattern.

5. The camera module according to claim 3, wherein the organic substance member is provided to be surrounded by the pattern.

6. The camera module according to claim 5, wherein the organic substance member is provided to surround the pattern.

7. The camera module according to claim 1, wherein the edge portion includes a foot portion and the organic substance member is provided between the foot portion and a portion of the flexible printed board which corresponds to a position of the foot portion.

8. The camera module according to claim 7, wherein a portion of the foot portion, in which the organic substance member is provided, has unevenness.

9. The camera module according to claim 1, wherein at a substantially rectangular peripheral portion of the sensor on the flexible printed board, an extension of a portion at which the organic substance member is defined and an extension of a portion at which an uncured resin portion that is not cured is defined are orthogonal to each other.

* * * * *